United States Patent
Kelkar et al.

(10) Patent No.: US 7,355,486 B2
(45) Date of Patent: Apr. 8, 2008

(54) CURRENT CONTROLLED OSCILLATION DEVICE AND METHOD HAVING WIDE FREQUENCY RANGE

(75) Inventors: Ram Kelkar, South Burlington, VT (US); Anjali R. Malladi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 11/278,196

(22) Filed: Mar. 31, 2006

(65) Prior Publication Data

US 2007/0229173 A1    Oct. 4, 2007

(51) Int. Cl.
*H03L 7/08* (2006.01)
(52) U.S. Cl. .......... 331/16; 331/17; 331/18; 331/34; 327/157
(58) Field of Classification Search .......... 331/8, 331/16, 17, 18, 25, 34, 57, 175, 185; 327/156, 327/157
See application file for complete search history.

(56) References Cited

U.S. PATENT DOCUMENTS

| | | | |
|---|---|---|---|
| 5,272,453 A * | 12/1993 | Traynor et al. .......... 331/57 |
| 5,565,817 A * | 10/1996 | Lakshmikumar .......... 331/57 |
| 6,285,214 B1 | 9/2001 | Zipper .......... 326/83 |
| 6,614,316 B2 * | 9/2003 | Masenas et al. .......... 331/17 |
| 6,690,240 B2 * | 2/2004 | Maxim et al. .......... 331/17 |
| 6,693,495 B1 | 2/2004 | Wang .......... 331/36 C |
| 2004/0135640 A1 * | 7/2004 | Maneatis .......... 331/16 |
| 2005/0040898 A1 * | 2/2005 | Garvin .......... 331/34 |
| 2006/0022760 A1 | 2/2006 | Wu et al. .......... 331/51 |

* cited by examiner

*Primary Examiner*—Benny Lee
*Assistant Examiner*—Ryan J Johnson
(74) *Attorney, Agent, or Firm*—Cantor Colburn LLP; Michael J. LeStrange

(57) ABSTRACT

A current controlled, phase locked loop device includes a phase detector configured to compare a reference frequency to an output frequency of a current controlled oscillator (ICO), a charge pump coupled to the phase detector and a low pass filter coupled to the charge pump. A voltage to current (V to I) converter is coupled to the low pass filter, providing an output current for integral control of the ICO. A control circuit is coupled to the ICO, and receives increment and decrement outputs of the phase detector, wherein the control circuit is configured to provide proportional control of the ICO through an amount of bias current applied thereto.

5 Claims, 6 Drawing Sheets

CURRENT CONTROLLED OSCILLATION DEVICE AND METHOD HAVING WIDE FREQUENCY RANGE

BACKGROUND

The present invention relates generally to current controlled oscillation (ICO) devices, and, more particularly, to an improved ICO device and method having wide frequency range and integrated proportional frequency control capable of operation at low supply voltages.

Controlled oscillators are used in a variety of integrated circuits for applications such as, for example, signal generation and detection, as well as in phase locked loop (PLL) circuits. In a controlled oscillator, the frequency of an output signal is responsive to a control signal provided thereto. There are various types of controlled oscillators, with one of the more common types being a current controlled oscillator (ICO). A typical ICO includes a controlled current source coupled to a ring oscillator, which in turn features a chain of inverter stages (typically an odd number). The output of one inverter in the stage is coupled to the input of a succeeding inverter, and so on, with the output of the last inverter fed back to the input of the first inverter in the stage. Typical inverters are formed from CMOS transistors, although other types of devices may also be used.

The frequency of the output signal of an ICO is inversely proportional to the delay/switching time of the inverters that form the oscillator. In turn, the switching time of an inverter corresponds to the time needed to charge and discharge the input capacitance of a successive inverter to a level respectively above or below the switching threshold of the successive inverter. The charge and discharge period is determined by the magnitude of current that is used to charge the input capacitance. It is this charging current that is provided and controlled by the controlled current source.

One disadvantage associated with conventional current controlled oscillators is that the gain of the oscillator is not controllable at a given operating frequency. This is particularly the case for an oscillator that is used over a wide range of operating frequencies, as the gain of a conventional ICO (i.e., the relationship of output frequency versus bias current) is constrained by the desired frequency range. It would therefore be desirable to be able to configure a wide range oscillator for applications such as phase locked loops, for example, that also keeps the gain at a low level so that the overall loop bandwidth can be optimized.

SUMMARY

The foregoing discussed drawbacks and deficiencies of the prior art are overcome or alleviated by a current controlled, phase locked loop device including a phase detector configured to compare a reference frequency to an output frequency of a current controlled oscillator (ICO), a charge pump coupled to the phase detector and a low pass filter coupled to the charge pump. A voltage to current (V to I) converter is coupled to the low pass filter, providing an output current for integral control of the ICO. A control circuit is coupled to the ICO, and receives increment and decrement outputs of the phase detector, wherein the control circuit is configured to provide proportional control of the ICO through an amount of bias current applied thereto.

In another embodiment, a method for implementing current-based, phase locked loop control of a frequency generating device includes comparing a reference frequency to an output frequency of a current controlled oscillator (ICO) through a phase detector, filtering an output voltage of a charge pump coupled to the phase detector and converting the filtered output voltage to an output current for integral control of the ICO. A control circuit is configured for proportional control of ICO, the control circuit receiving increment and decrement outputs of said phase detector, and applying amount of bias current to the ICO, the bias current based on the value of the increment and decrement outputs of the phase detector.

In still another embodiment, a current controlled ring oscillator device, includes a first latch-based delay stage having outputs connected to inputs of a second latch-based delay stage, and outputs of the second delay stage coupled back to inputs of the first delay stage. The first and second delay stages each have a bias current applied thereto, the magnitude of the bias current dependent upon a pair of bias control signals applied to switching devices included within the first and second delay stages, wherein the magnitude of the bias current determines the output frequency of the oscillator device. The first and second delay stages each have a gain control signal applied thereto, wherein the gain control signal is configured to adjust the resistance of cross-coupled paths within the first and second delay stages.

BRIEF DESCRIPTION OF THE DRAWINGS

Referring to the exemplary drawings wherein like elements are numbered alike in the several Figures.

DETAILED DESCRIPTION

Disclosed herein is a novel current controlled oscillator that reduces jitter in a PLL by providing the capability of changing the gain of the ICO curves, depending upon the frequency of operation. By reducing the gain of the ICO, the PLL loop bandwidth can be shaped to reduce the overall jitter of the system. In addition, a novel control circuit provides both proportional and integral control for the ICO, which allows for the ICO to operate at low supply voltages.

Figure 1:
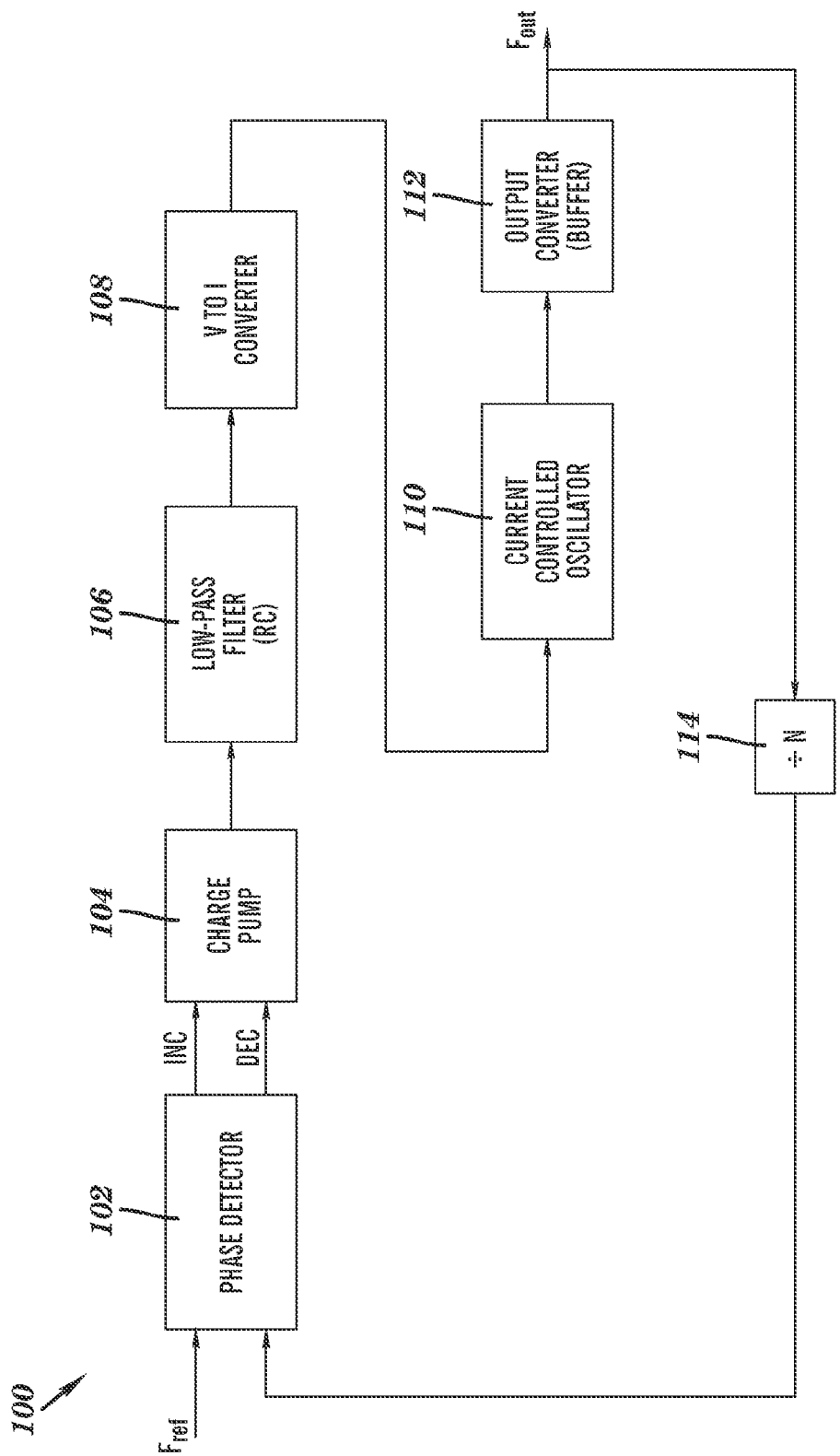
FIG. 1 is a schematic block diagram of a phase locked loop employing a conventionally configured current controlled oscillator.

Referring initially to FIG. 1, there is shown a schematic diagram of a phased locked loop 100 utilizing a conventional current controlled oscillator. As is shown, the PLL 100 includes a phase detector 102, charge pump 104, low pass filter 106 (with at least one resistor element and one or more capacitor elements), voltage to current converter 108, and a current controlled oscillator 110 and output buffer 112 placed in a negative feedback configuration. There may also be a divide-by-N counter 114 included in the feedback path in order to obtain fractional multiples of the reference frequency $F_{ref}$ out of the PLL 100.

The ICO 110 generates a periodic output signal $F_{out}$ that is compared to the reference frequency $F_{ref}$. If the output signal $F_{out}$, for example, begins to fall behind the reference frequency, then the phase detector 102 causes the charge pump 104 (through output signal "INC") to change the control voltage (converted to control current) to speed up the ICO 110. Conversely, if the output signal begins to creep ahead of the reference signal, than the phase detector 102 causes the charge pump 104 (through output signal "DEC") to change the control current to slow down the ICO 110. The low pass filter 106 provides both proportional and integral control of the ICO 110, and smoothes out any abrupt control inputs from the charge pump 104.

As indicated previously, ICOs (such as those built on microprocessor chips), being formed from a ring of active delay stages, suffer from more jitter than other types of oscillators as a result of the fixed gain thereof over a given range of operating frequencies and the consequent inability to shape the loop bandwidth.

Figure 2:
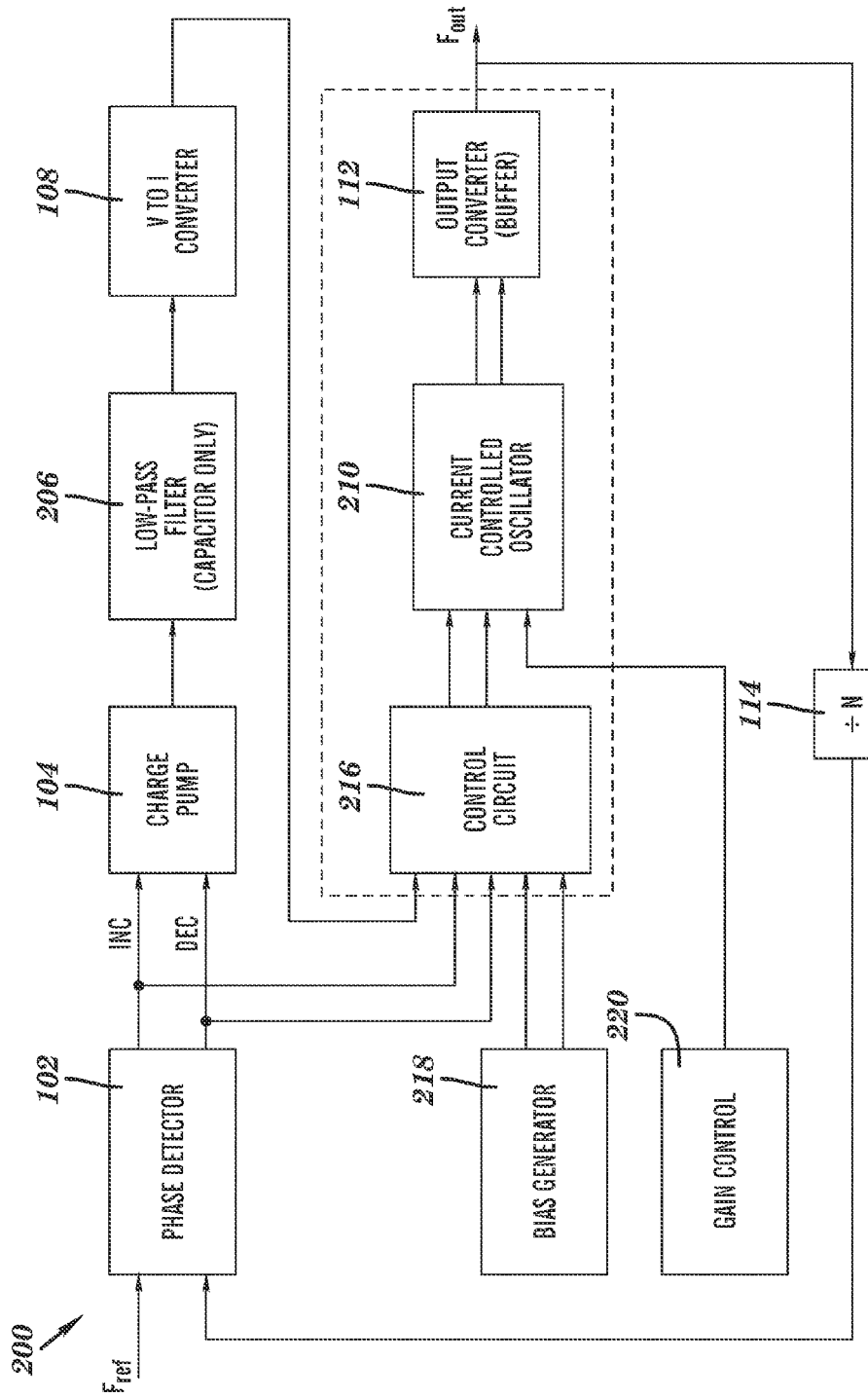
FIG. 2 is a schematic block diagram of a phase locked loop employing a current controlled oscillator configured in accordance with an embodiment of the invention.

Therefore, in accordance with an embodiment of the invention, FIG. 2 illustrates a schematic block diagram of a phase locked loop 200 employing a novel current controlled oscillator 210 and associated control circuit 216, featuring a wide frequency range, integrated and proportional control, and wherein the gain may be adjustably decreased at a given operating frequency in order to provide improved noise performance at low operating voltages. For ease of description, similar components of a phased locked loop are designated with the same reference numerals as shown in FIG. 1.

It will first be noted that the control circuit 216 provides proportional frequency control for the ICO 216 by receiving the INC and DEC outputs from the phase detector 102. The INC and DEC pulses are compared within the control circuit 216, and determine the amount of bias current provided to the ICO 210, which in turn determines the frequency of operation thereof. As such, the low-pass filter 206 need only provide a capacitive element for integral frequency control, the voltage of which is again converted to a current through V to I converter 108. As described in further detail hereinafter, the output of the V to I converter 108 is used by the control circuit 216 and thus the ICO 210.

A bias generator 218 provides a pair of reference current signals for use by the control circuit 216 in determining control voltages applied to the ICO delay elements, that in turn control the bias current of the ICO 210 and hence the frequency thereof. In addition, a gain control block 220 provides a control signal applied directly to delay elements of the ICO 210 so as to adjustably control the amount of gain of the elements and thereby select the gain of the ICO 210. The operation of the gain control feature is also described in further detail hereinafter.

Figure 3:
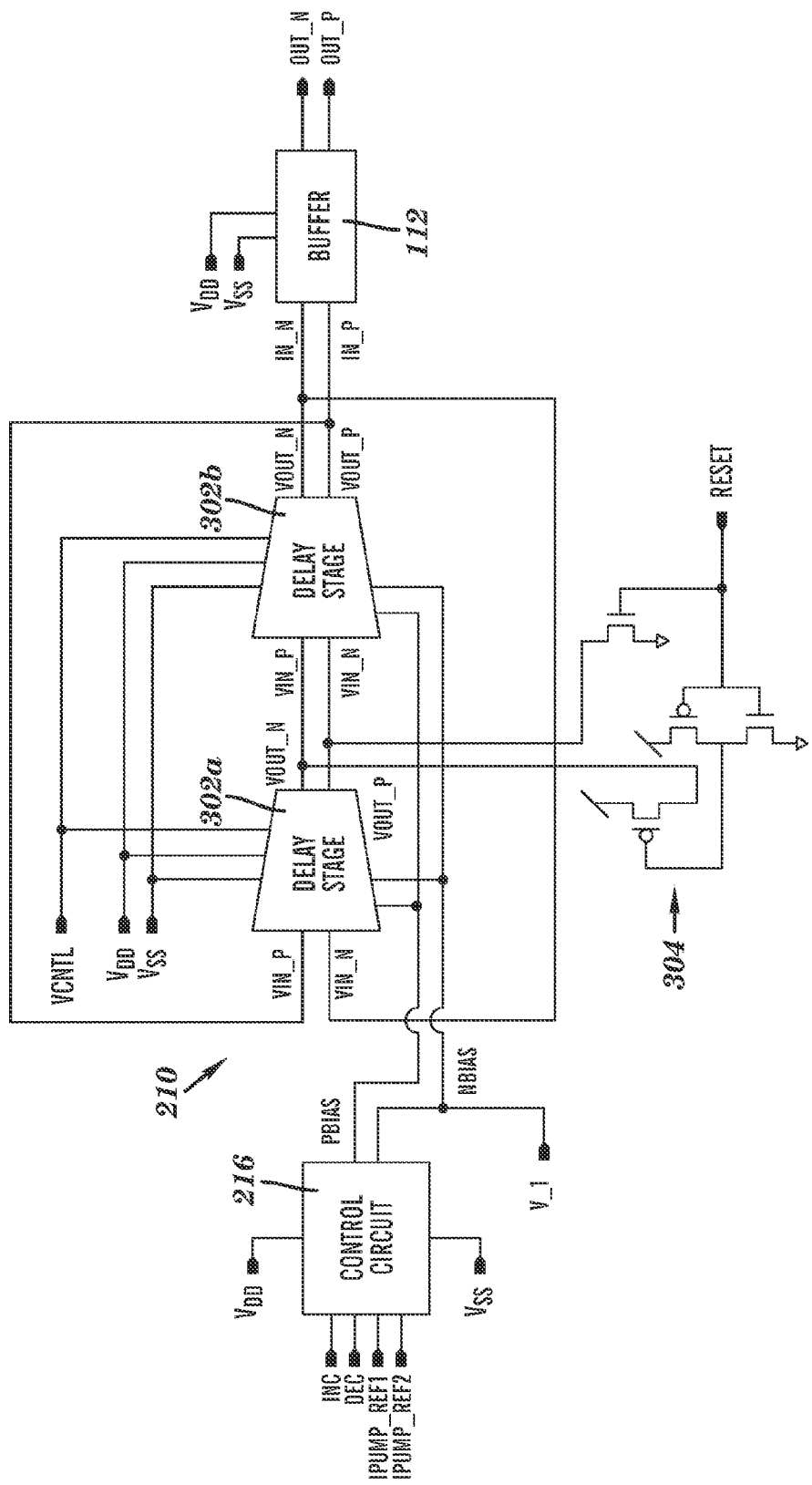
FIG. 3 is a more detailed block diagram of the control circuit and current controlled oscillator of FIG. 2.

Referring now to FIG. 3, a more detailed block diagram of the dashed portion of FIG. 2 is illustrated. In particular, the ICO 210 includes (in an exemplary embodiment) a two-stage, latch-based configuration. Because both delay stages 302a, 302b utilize differential inputs and outputs (i.e., the logical true and complement signals of the latch), an odd number of stages is not needed. In addition to the power rail inputs ($V_{DD}$, $V_{SS}$) each latch delay stage 302a, 302b is provided with the gain control signal VCNTL generated by the gain control block 220 of FIG. 2. As also shown in FIG. 3, a reset circuit 304 is provided in order to initially establish complementary input voltages to the input terminals VIN_P, VIN_N, of the second delay stage 302b and facilitate the oscillating output of the ICO 210.

The inputs and outputs of the control circuit 216 are also labeled in FIG. 3. The inputs include the INC signal and DEC signal from the phase detector 102 of FIG. 2, as well as the two reference signals IPUMP_REF1, IPUMP_REF2, generated by the bias generator 218. The output current from the V to I converter 108 is input into the control circuit 216, the node voltage of which (NBIAS) represents one of the two bias voltages for the delay stages 302a, 302b, that in turn control the bias current thereof. The other bias voltage (PBIAS) is an output of the control circuit 216, which is described in additional detail later.

Figure 4:
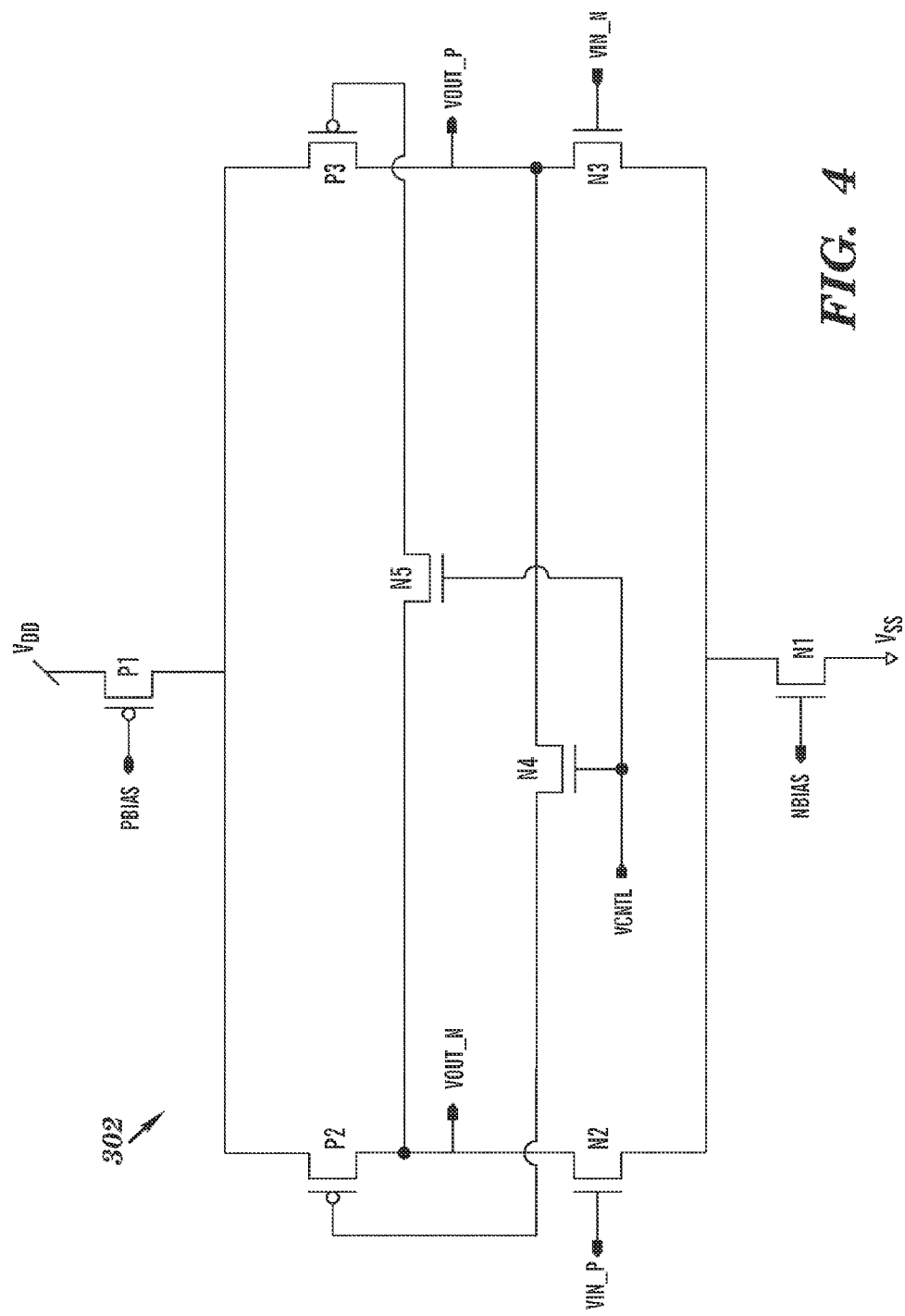
FIG. 4 is a schematic diagram illustrating an exemplary delay stage used in the current controlled oscillator of FIGS. 2 and 3.

FIG. 4 is a schematic diagram illustrating an exemplary delay stage 302 used in the current controlled oscillator 210 of FIGS. 2 and 3. As is shown, the stage 302 includes biasing transistors P1 and N1, the conductivity of which determines the amount of current through the cell and hence the frequency. A higher cell current leads to a higher frequency because the cell delay is reduced. The fully differential cell can thus be used to build ring oscillators of varying lengths. The gate of P1 is coupled to PBIAS, the voltage of which is determined by control circuit 216, while the gate of N1 is controlled by the voltage at NBIAS, coupled to the output of the V to I converter 108 as stated above. The latch portion of the delay stage 302 includes NFETs N2 and N3, along with PFETs P2 and P3. In the embodiment depicted, the input signals to the stage 302 (VIN_P, VIN_N) are shown coupled to NFETS N2 and N3, respectively, while the PFETs P2 and P3 are cross-coupled. However, the input signals could alternatively be coupled to P2 and P3 with N2 and N3 being cross-coupled.

As will further be noted from FIG. 4, PFETs P2 and P3 are cross-coupled through a pair of NFETs N4 and N5. This provides the adjustable gain control of the ICO through a suitable voltage on VCNTL. The higher the biasing voltage of VCNTL, the more conductive the cross coupling paths and thus the greater the gain. In a conventionally configured delay latch, the cross coupling is a direct short circuit, and thus the gain of the cell is maximized and not adjustable. Accordingly, where it is desired to reduce the gain of the ICO, the value of VCNTL can be lowered so as to increase the resistance of the cross coupling paths.

Figure 5:
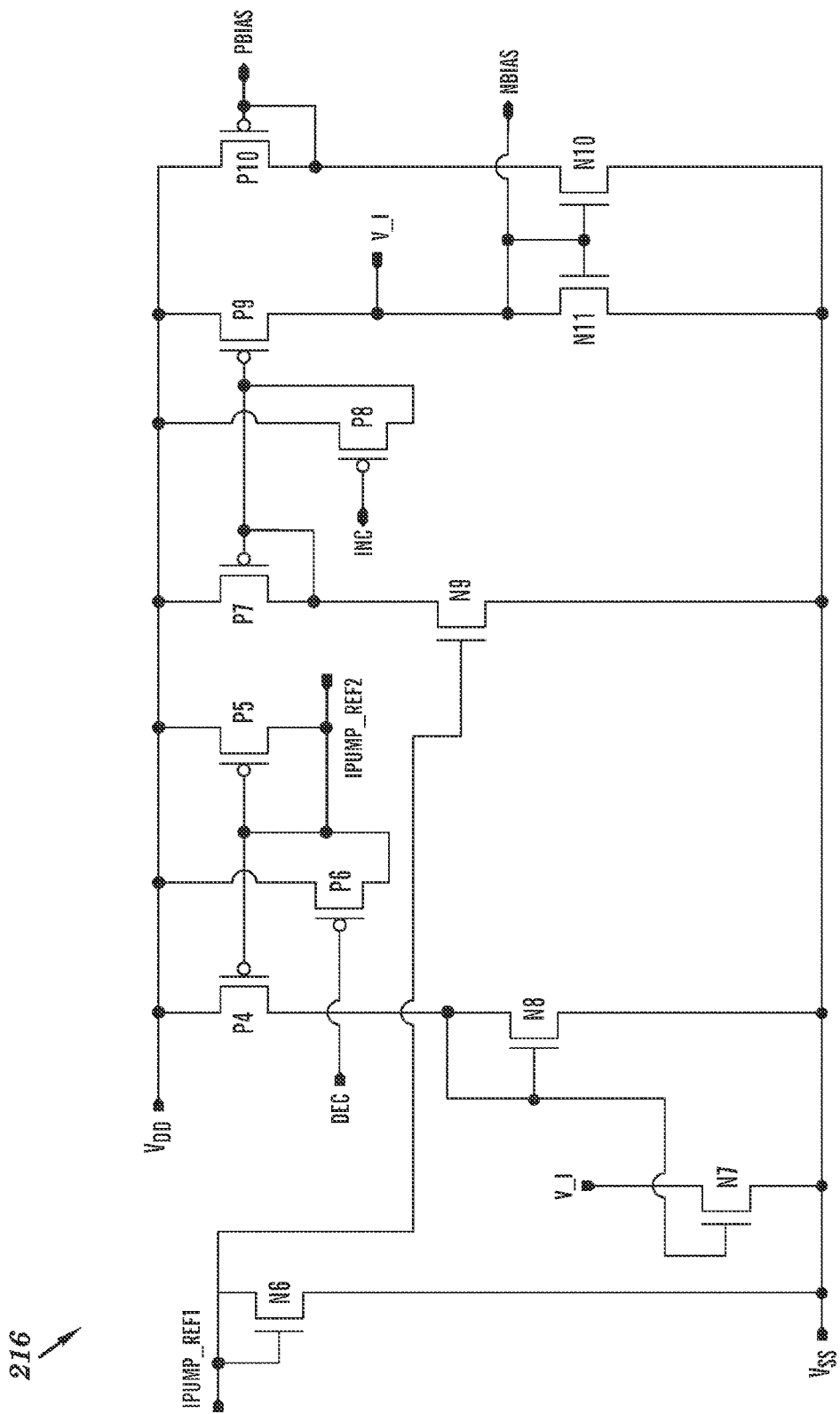
FIG. 5 is a detailed schematic diagram of the control circuit of FIGS. 2 and 3.

Referring now to FIG. 5, the control circuit 216 is schematically illustrated in further detail. When the output frequency of the ICO is equal to the reference frequency, no changes in the output frequency are needed. In other words, the output values INC and DEC of the phase detector are zero. As to the increment portion of the control circuit, it will be seen that so long as INC is zero, PFET P8 will maintain the gate of PFET P9 at the supply rail, thus keeping P9 off. Therefore, the only current flowing through diode configured NFET N11 is from the V_I current input (generated by V_I converter 108). The voltage at this node also represents the output NBIAS voltage used to control the N1 gate of the delay stages of FIG. 4. Conversely, the diode connected PFET P10, in series with NFET N10 determines the output PBIAS voltage used to control the P1 gate of the delay stages of FIG. 4.

Thus, it will be seen that the V_I current input provides the integral portion of the control of the ICO. In the event that the phase detector 102 (FIG. 1) determines that the output frequency falls behind the reference frequency, then the value of INC changes to high, thereby disabling PFET P8. As a result, the gate of PFET P9 and diode connected PFET P7 are decoupled from the supply rail. This allows current to flow through the current mirror P7 and N9, as determined by IPUMP_REF1 and N6, and consequently through P9. The result is to (proportionally) add to the amount of current provided by V_I, which in turn increases the value of NBIAS and decreases the value of PBIAS, thereby providing more bias current to the delay cells and increases the oscillation frequency thereof. Once the output frequency catches up to the reference frequency, INC will return to low and cause P8 to deactivate P9 and remove the extra current flowing through N11. This returns the ICO back to the integral control thereof, as determined by the value of V_I.

On the other hand, if the output frequency begins to exceed the reference frequency, then the value of DEC changes to high, thereby disabling PFET P6 and decoupling PFET P4 and diode connected PFET P5 from the supply rail. Once current begins to flow through P4 and diode connected NFET N8 (as determined by IPUMP_REF2), N7 will become conductive. Because N7 is connected in parallel with respect to N11 it will therefore (when rendered conductive) decrease the amount of current through N11 as supplied by V_I. This results in decreasing the voltage at output NBIAS and increasing the voltage at output PBIAS, thereby decreasing the bias current applied to the delay cells and reducing the output frequency thereof. Once the output frequency again matches the reference frequency, DEC will return to zero, thus causing the gates of P4 and P5 to be pulled back up to $V_{DD}$, shutting off current through N7 and increasing the value of current through N11 to the amount determined by integral current control signal V_I. In the exemplary embodiment depicted, the frequency range of the ICO 210 with a supply voltage of about 0.8 V is about 70 MHz to about 1033 MHz, representing a factor of more than 10.

One key advantage of this method of proportional control is that the amount of current added to or subtracted from the V_I current is easy to change, simply by changing the bias voltage at nodes IPUMP_REF1 and IPUMP_REF2. Changing the current added or subtracted is equivalent to changing the value of the "R" in the RC low pass filter of FIG. 1. The loop bandwidth and the damping are affected by the equivalent resistance, and thus this provides an easy way to control both the loop bandwidth and damping.

Figure 6:
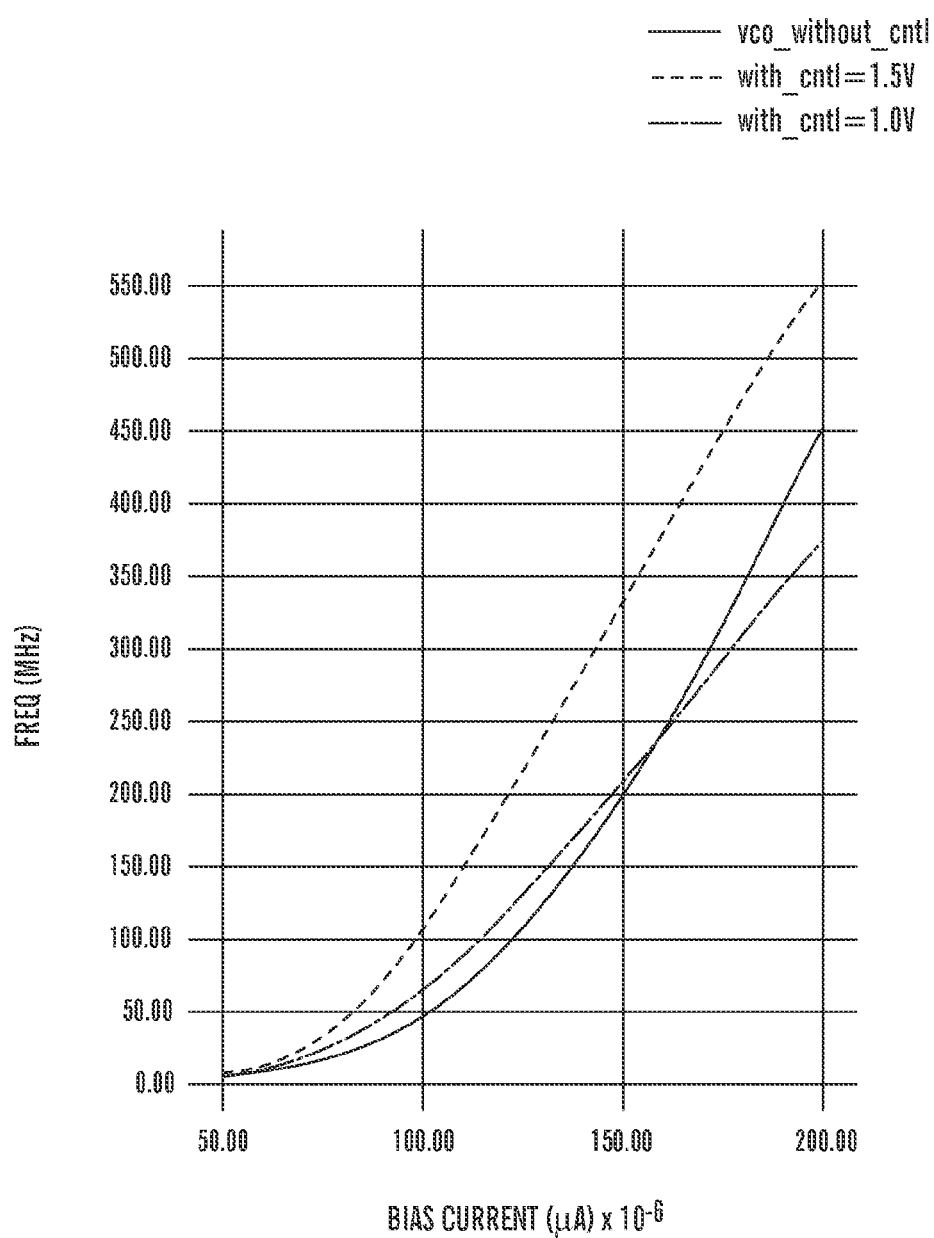
FIG. 6 is a graph illustrating bias current versus frequency curves for the current controlled oscillator, as a function of the adjustable gain of the delay stages, in accordance with a further embodiment of the invention.

Finally, FIG. 6 is a plot of the output frequency versus the bias current at two different values of the control voltage VCNTL (which again represents the output of the gain control block 220 of FIG. 2). As can be seen, the effect of the VCNTL is to flatten the curves such that the gain is reduced. By way of example, at an operating frequency of 300 MHz, the gain is about 4.93 MHz/μA with VCNTL=1.0 V, but only 3.21 MHz/μA with VCNTL=1.5V. Also shown in FIG. 6 is the output frequency vs. bias current curve for a conventional delay cell with no gain control capability. That is, the NFETs N4 and N5 in FIG. 4 are simply replaced with short circuits. As will thus be appreciated, the use of the series NFETs along with a variable VCNTL voltage affords a means of changing the slope (i.e., the gain) of the characteristics at any desired frequency. The gain of an oscillator impacts the phase noise characteristics through the bandwidth of the control loop. Thus, by reducing the bandwidth of the loop, the output noise may also be reduced.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for implementing current-based, phase locked loop control of a frequency generating device, the method comprising:

comparing a reference frequency to an output frequency of a current controlled oscillator (ICO) through a phase detector;

filtering an output voltage of a charge pump coupled to said phase detector and converting the filtered output voltage to an output current for integral control of said ICO; and configuring a control circuit for proportional control of said ICO, said control circuit receiving increment and decrement outputs of said phase detector, and applying amount of bias current to said ICO, said bias current based on the value of said increment and decrement outputs of said phase detector, wherein said ICO further comprises a first latch-based delay stage having outputs connected to inputs of a second latch-based delay stage, and outputs of said second delay stage coupled back to inputs of said first delay stage;

wherein said control circuit generates first and second output bias voltages used to determine the amount of bias current utilized by said first and second latch-based delay stages, said first and second output bias voltages being a function of said integral control output current of said V to I converter.

2. The method of claim 1, wherein said first and second output bias voltages of said control circuit are also a function of said increment and decrement outputs of said phase detector, thereby providing proportional control of said ICO.

3. The method of claim 2, further comprising generating current reference signals for said control circuit, said current reference signals determining the extent to which said increment and decrement outputs of said phase detector provide proportional control of said output frequency.

4. A method for implementing current-based, phase locked loop control of a frequency generating device, the method comprising:

comparing a reference frequency to an output frequency of a current controlled oscillator (ICO) through a phase detector;

filtering an output voltage of a charge pump coupled to said phase detector and converting the filtered output voltage to an output current for integral control of said ICO; and configuring a control circuit for proportional control of said ICO, said control circuit receiving increment and decrement outputs of said phase detector, and applying amount of bias current to said ICO, said bias current based on the value of said increment and decrement outputs of said phase detector, wherein said ICO further comprises a first latch-based delay stage having outputs connected to inputs of a second latch-based delay stage, and outputs of said second delay stage coupled back to inputs of said first delay stage, and wherein said ICO is configured for gain control thereof.

5. The method of claim 4, wherein said gain control is implemented through a gain control signal configured to adjust the resistance of cross-coupled paths within said first and second delay stages.

* * * * *